US011349375B2

(12) United States Patent
De Filippis

(10) Patent No.: US 11,349,375 B2
(45) Date of Patent: May 31, 2022

(54) ELECTRIC MACHINE WITH A HEAT TRANSFER DEVICE FOR TRANSFERRING HEAT FROM AN ELECTRONIC COMPONENT TO A HEAT SINK

(71) Applicant: SPAL AUTOMOTIVE S.r.l., Correggio (IT)

(72) Inventor: Pietro De Filippis, Varazze (IT)

(73) Assignee: SPAL AUTOMOTIVE S.R.L., Correggio (IT)

( * ) Notice: Subject to any disclaimer, the term of this patent is extended or adjusted under 35 U.S.C. 154(b) by 300 days.

(21) Appl. No.: 16/490,379

(22) PCT Filed: Feb. 27, 2018

(86) PCT No.: PCT/IB2018/051235
§ 371 (c)(1),
(2) Date: Aug. 30, 2019

(87) PCT Pub. No.: WO2018/158685
PCT Pub. Date: Sep. 7, 2018

(65) Prior Publication Data
US 2020/0076278 A1 Mar. 5, 2020

(30) Foreign Application Priority Data
Mar. 3, 2017 (IT) .................. 102017000024276

(51) Int. Cl.
*H02K 11/33* (2016.01)
*H02K 5/18* (2006.01)
(Continued)

(52) U.S. Cl.
CPC .......... *H02K 11/33* (2016.01); *H01L 23/3672* (2013.01); *H01L 23/40* (2013.01);
(Continued)

(58) Field of Classification Search
CPC ............... H05K 7/2039; H05K 7/2049; H05K 7/20154; H05K 7/20454; H05K 7/209;
(Continued)

(56) References Cited

U.S. PATENT DOCUMENTS

2011/0157897 A1\* 6/2011 Liao ..................... H05K 1/021
362/294
2014/0139059 A1\* 5/2014 De Filippis .......... H05K 1/0263
310/64
(Continued)

FOREIGN PATENT DOCUMENTS

DE 102010013334 A1 5/2012
DE 102010013334 A1 \* 10/2012 ............... H05K 7/20
(Continued)

OTHER PUBLICATIONS

English Translation of DE102010013334A1, Appl; Ralph, 10-12 (Year: 2012).\*
(Continued)

*Primary Examiner* — Zachary Pape
*Assistant Examiner* — Amir A Jalali
(74) *Attorney, Agent, or Firm* — Shuttleworth & Ingersoll, PLC; Timothy Klima

(57) ABSTRACT

A rotary electric machine includes an electronic module and a heat sink for dissipating heat produced by the module. The module includes a printed circuit, an electronic component having a base positioned on the printed circuit, a heat transfer device connected to the printed circuit and to the electronic component for transferring heat generated by the component to the heat sink. The heat transfer device includes an upper portion extending from the printed circuit towards the heat sink from the same side of the component and a base portion connected to the upper portion and positioned in the printed circuit at least partly under the
(Continued)

component to form, at least partly, a preferential path for the heat, from the base of the electronic component to the heat sink. The electronic component is connected at least partly by its own base to the base portion of the heat transfer device.

14 Claims, 5 Drawing Sheets

(51) Int. Cl.
| | | |
|---|---|---|
| *H02K 11/00* | (2016.01) | |
| *H01L 23/367* | (2006.01) | |
| *H01L 23/40* | (2006.01) | |
| *H05K 1/02* | (2006.01) | |
| *H05K 7/20* | (2006.01) | |
| *H01L 23/373* | (2006.01) | |

(52) U.S. Cl.
CPC ........... *H02K 5/18* (2013.01); *H02K 11/0094* (2013.01); *H05K 1/0201* (2013.01); *H01L 23/3736* (2013.01); *H01L 2023/4043* (2013.01); *H05K 7/209* (2013.01); *H05K 7/20509* (2013.01)

(58) Field of Classification Search
CPC ..... H05K 1/0201–0203; H05K 1/0209; H05K 1/021; H05K 1/182; H05K 2201/10166; H01L 23/367; H01L 23/3675; H01L 23/3672; H01L 23/3736; H01L 23/40–4006; H01L 23/4081; H01L 23/4087; H01L 23/4037; H01L 23/405; H01L 2023/4043; H01L 2023/4075–4087; H02K 5/04; H02K 5/15; H02K 5/18; H02K 5/136; H02K 5/1672; H02K 5/1732; H02K 2211/03; H02K 11/00; H02K 11/33; H02K 11/0094; H02K 11/25; H02K 11/12; H02K 11/22; H02K 15/00

See application file for complete search history.

(56) References Cited

U.S. PATENT DOCUMENTS

| | | | | |
|---|---|---|---|---|
| 2016/0006322 | A1* | 1/2016 | De Filippis | ............ H02K 15/00 |
| | | | | 310/64 |
| 2017/0077788 | A1* | 3/2017 | El Baraka | ................ H02K 5/22 |
| 2017/0256473 | A1* | 9/2017 | Hsieh | ..................... H01L 23/367 |
| 2017/0358973 | A1* | 12/2017 | Jugovic | ................ H01R 13/665 |
| 2020/0076278 | A1* | 3/2020 | De Filippis | .......... H05K 1/0201 |

FOREIGN PATENT DOCUMENTS

| | | | | |
|---|---|---|---|---|
| EP | 2215705 | A2 | 8/2010 | |
| WO | 2013008180 | A2 | 1/2013 | |
| WO | WO2014125412 | * | 2/2013 | ............... H02K 9/22 |
| WO | 2014125412 | A1 | 8/2014 | |

OTHER PUBLICATIONS

The Guide to FR-4 for your printed circuits, Photo-Electronics.com. Oct. 2019 (Year: 2019).*
Transistor Packages, interface.com, Oct. 2009 (Year: 2009).*
International Search Report dated May 29, 2018 from counterpart International Application No. PCT/IB2018/051235.

* cited by examiner

ELECTRIC MACHINE WITH A HEAT TRANSFER DEVICE FOR TRANSFERRING HEAT FROM AN ELECTRONIC COMPONENT TO A HEAT SINK

This application is the National Phase of International Application PCT/IB2018/051235 filed Feb. 27, 2018 which designated the U.S.

This application claims priority to Italian Patent Application No. 102017000024276 filed Mar. 3, 2017, which application is incorporated by reference herein.

TECHNICAL FIELD

This invention relates to a rotary electric machine with reference in particular to an integrated electronic control module.

In general, a rotary electric machine, for example a brushless electric motor to which reference is made hereinafter without limiting the scope of the invention, comprises a casing having inside a stator, rigidly connected to the casing, and a rotor, for example with permanent magnets, rotatably connected to the casing.

BACKGROUND ART

An example of a prior art electric machine used as a reference for the present patent is described in the application WO2013008180 in the name of the same Applicant.

An electronic module or electronic control module, connected to the stator, comprising a printed circuit and a plurality of active and passive electronic components forming a power section and a plurality of electronic signal components forming a control section, mounted on the printed circuit.

A cap closes the casing to form a closed container from which connection terminals protrude for the power supply and control connections of the control electronics.

One of the principle difficulties in the above-mentioned electric machines, in particular in those of the "sealed" type, is the dispersal of the heat produced by the electronic module during operation of the electric machine.

A solution intended to overcome said difficulty is described in the document WO2014125412 in the name of the same Applicant.

The electric machine described in that document comprises, with reference to FIG. 9 relative to the prior art, an electronic module which in turn comprises a printed circuit 10, whose thermal conductivity is negligible, and a plurality of surface-mount electronic components, also indicated as "SMD electronic components", including, for example, power MOSFETs 15 each equipped with a respective case 13.

The machine is equipped with a heat sink for dissipating the heat generated by the electronic module and to which the above-mentioned MOSFETs 12 face; the heat sink, in the example illustrated, preferably comprises the cap 3 of the electric machine.

So as to maximize the heat exchange between the MOSFETs 12 and the heat sink 3, the electronic module comprises, for each MOSFET 12, a heat transfer device 19 which is connected to the printed circuit at the respective MOSFET 12 to transfer the heat generated by the MOSFET 12 to the cap 3.

More specifically, it should be noted that, in the example illustrated, the transfer device 19 is soldered to the so-called "tab" of the MOSFET 12 which usually has a tab which extends outside the case 13.

The heat generated by the MOSFET 12 during its operation therefore flows along the tab and from this to the heat transfer device 19 which, placed in contact with the cap 3, by a thermally conductive and electrically insulating paste 24, transfers the heat to the cap 3.

Today, the market specifies electric machines, particularly those of the sealed type, which provide greater efficiency and higher power outputs than electric machines of the known type and provide this higher performance in units of the same size. The development of these high performance electric machines has lead to the adoption, in the electronic drive module, of electronic power components with ever lower internal resistances. The purpose of this development is to limit the losses due to the Joule effect.

However, despite the relatively low internal resistance of the electronic power components the circulating currents in the electronic power components can cause relatively high losses due to the Joule effect. This is especially the case in high power applications (those with ratings of more than a kilowatt) and in applications with low voltage power supplies (operating with just a few volts), which is typical of automotive applications.

A further basic design constraint is that the heat generated by each electronic power component must not decrease the efficiency of the electronic module of the machine.

In a parallel fashion, the electronic components such as the MOSFETs are evolving towards increasingly miniaturised solutions, wherein the tab is very thinned and, sometimes, is no longer projecting outside the case of the respective MOSFET. In these circumstances, the cooling system of the electronic components such as, for example, described in patent application WO2014125412 could be insufficient to guarantee the expected performance.

In fact, the heat generated by the MOSFETs, as already mentioned, must flow through the tab and the flap to the heat transfer device: in the case of high heat development, in particular with thinned tabs and, possibly, without a flap (in which case it is not possible to effectively connect the heat transfer device to the respective MOSFET), the overall temperature of the electronic module could rise above the limits to optimum operating limits.

In this context, the primary technical purpose of this invention is to overcome the above-mentioned drawbacks.

DISCLOSURE OF THE INVENTION

The aim of this invention is to provide a rotary electric machine which disperses the heat generated internally and in particular the heat produced by the electronic control module and to do this more effectively than prior art devices in order to increase the reliability.

The technical purpose indicated and at least the aim specified are substantially achieved by a rotary electric machine which has features as disclosed herein.

According to an aspect of the invention, the invention relates to a rotary electric machine, preferably a brushless electric motor.

The electric machine in accordance with an aspect of the invention comprises an electronic module and a heat sink for dissipating the heat generated by the electronic module.

The heat sink may be, for example, a cap of the electric machine.

The electronic module comprises, for example, a printed circuit, or PCB, at least one electronic component having a base positioned on the printed circuit, a heat transfer device connected to the printed circuit and to the electronic component for transferring the heat generated by the electronic component to the heat sink.

In general, the base or "tab" of the electronic component is part of the packaging for supporting the chip and has both a mechanical function and a thermal and electrical function.

The electronic component may be, for example, a power MOSFET to which reference is made but without thereby limiting the scope of the invention.

According an aspect of the invention, the heat transfer device comprises an upper portion extending from the printed circuit towards the heat sink of heat from the same side of the electronic component.

According to an aspect of the invention, the heat transfer device comprises a base portion connected to the upper portion and positioned in the printed circuit at least partly under the electronic component to form, at least partly, a preferential path for the heat generated by the electronic component from the base of the electronic component to the heat sink.

According an aspect of the invention, the electronic component is connected at least partly by its own base to the base portion of the heat transfer device.

The heat generated, in use, by the electronic component, for example a MOSFET, is transferred, by the base of the electronic component, to the base portion of the heat transfer device.

Heat can move from the base portion of the heat transfer device towards the upper portion and from there to the heat sink.

According to an aspect of the invention, the heat transfer device may be equipped with several electronic components the bases of which are connected to the base portion of a single heat transfer device.

According to an aspect of the invention, the printed circuit comprises a seat for the base portion of the heat transfer device.

The base portion of the heat transfer device is inserted in the respective seat which is preferably under the electronic component.

In an embodiment, the seat for the base portion of the heat transfer device is in the form of a through hole in the printed circuit.

In an embodiment, the seat for the base portion of the heat transfer device is in the form of a blind hole in the printed circuit.

In an embodiment, the base portion of the heat transfer device is incorporated herein in the printed circuit, for example as a thermally conductive plug.

According to an aspect of the invention, the base portion of the heat transfer device has an upper face coplanar with an upper face of the printed circuit and the electronic component may be at least partly connected to the upper face of the base portion of the heat transfer device.

In this way, moreover, the presence of the heat transfer device, and in particular the base of it does not influence the making of the electronic module since the electronic power components can be applied on coplanar surfaces.

According to an aspect of the invention, the upper portion of the heat transfer device comprises at least a first flap which projects from the base portion of the heat transfer device on the printed circuit and is thermally in contact with the heat sink.

The first flap extends preferably on the printed circuit from the same side of the electronic component preferably at the electronic component.

According to an aspect of the invention, the height of the upper portion of the heat transfer device measured in a direction substantially perpendicular to the printed circuit is less than the height of the electronic component measured in the same direction.

In this way the MOSFET acts as an element for spacing the heat sink from the heat transfer device thus preventing short circuits which would occur by direct contact between the heat transfer device, which is usually an element with high thermal and electrical conductivity, and the heat sink.

According to an aspect of the invention, the machine comprises a layer of thermally conductive material interposed at least between the upper portion of the heat transfer device and the heat sink.

In this way, the heat transfer device transfers the heat generated by the electronic component to the heat sink by means of the thermally conductive material.

More precisely, the heat flows from the base of the MOSFET to the base portion of the heat transfer device, from this to the upper portion and, through the layer of thermally conductive material, from the upper portion to the cap of the motor.

According to an aspect of the invention, the first flap has a lower face substantially coplanar with an upper face of the printed circuit.

The first flap is connected to the printed circuit by a relative lower face.

Since, as mentioned, the upper face of the base portion of the heat transfer device is preferably coplanar with the upper face of the printed circuit, the relative positioning of the lower face of the upper portion and the upper face of the base portion, that is, the shape of the heat transfer device, takes into account the thickness of a solder paste normally provided under the upper portion for fixing the heat transfer device to the printed circuit.

According to an aspect of the invention, the base portion of the heat transfer device has an upper face coplanar with an upper face of the printed circuit and the first flap has a lower face substantially coplanar with the upper face of the printed circuit except at least for the thickness of the solder paste.

According to an aspect of the invention, the MOSFET is connected to the upper face of the base portion and the transfer device is connected to the printed circuit by means of the lower face of the first flap.

The upper face of the base portion and the upper face of the printed circuit are coplanar and the MOSFET may be soldered by its own base to the base portion of the heat transfer device and with the relative terminals to the printed circuit.

In an embodiment, the upper portion and the base portion of the heat transfer device are soldered to each other.

In an embodiment, the upper portion and the base portion of the heat transfer device are made in a single body, that is, the heat transfer device is formed by a single element comprising the upper portion and the base portion.

According to an of the invention, the heat transfer device is preferably made by drawing and/or pressing and cutting from a tinned sheet of thermally conductive material.

The solution is particularly advantageous relative to the making of the single heat transfer devices from a non-tinned sheet and subsequent tinning of the single parts.

According to an aspect of the invention, the base portion of the heat transfer device has plan dimensions which are greater than or equal to the plan dimensions of the electronic component.

According to an aspect of the invention, the electronic component is soldered at least partly to the base portion of the heat transfer device.

According to an aspect of the invention, the base portion of the transfer device has an accessible lower face which may be coplanar with a lower face of the printed circuit, projecting from the lower face of the printed circuit or recessed in the printed circuit relative to its lower face.

The printed circuit comprises a seat in the form of a hole passing through the base portion of the heat transfer device and the base portion of the heat transfer device is inserted in the respective seat.

Compared with the prior art heat joint solutions the thermal resistance is eliminated between the base of the MOSFET, or of the electronic component in general, and the heat transfer device, due substantially to the presence of a solder paste necessary for joining the flap, having already a relatively small section, which extends outside the case of the electronic component to the heat transfer device; in that way, the performance of the electronic module is improved in terms of discharging the heat.

The electronic modules of the electric machines comprise a plurality of MOSFETs.

The heat transfer device allows most of the heat generated by the corresponding MOSFETs connected to it to be drawn off, starting from the base, and transferred to the cap from where it is then dissipated. This prevents the heat from flowing through the printed circuit and causing overheating.

The heat transfer devices effectively draw off the heat from the tab of the respective MOSFET thanks to the high thermal conductivity of the heat transfer device and it is effectively exchanged with the cap of the electric machine thanks in particular to the extension of the relative upper face defined by the upper portion of each heat transfer device.

When the base portion is also accessible from the other side of the PCB, that is, when the seat of the base portion of the heat transfer device is a through hole, heat may also be dissipated from that side of the printed circuit.

According to an aspect of the invention, a heat transfer device of the type described may also be used in applications different to the electric machine, for example in external electronics for controlling static converters.

BRIEF DESCRIPTION OF DRAWINGS

Other features and advantages of the invention are more apparent in the detailed description below, with reference to a non-limiting and non-exclusive preferred embodiment of a rotary electric machine, as illustrated in the accompanying drawings, in which.

DETAILED DESCRIPTION OF PREFERRED EMBODIMENTS OF THE INVENTION

Figure 1:
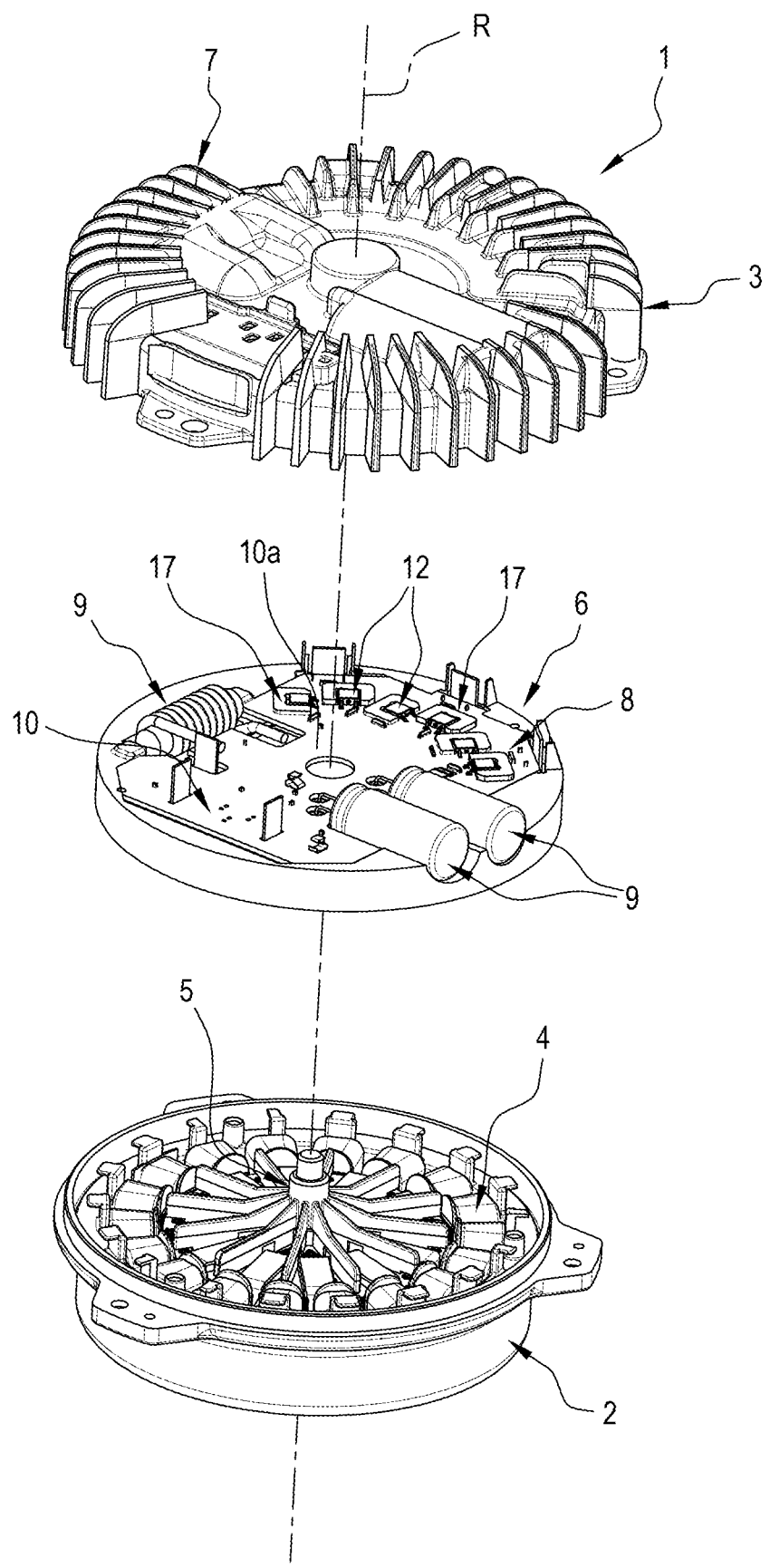
FIG. 1 illustrates a schematic exploded perspective view of a rotary electric machine in accordance with the invention with some parts cut away for greater clarity.

With particular reference in particular to FIG. 1, the numeral 1 denotes a rotary electric machine according to at least one aspect of the invention.

The machine 1, in one embodiment, is an electric motor of the sealed type, that is, without any openings for access to the inside, to which express reference will hereinafter be made but without thereby limiting the scope of the invention.

The electric machine 1 will be described in detail solely for the parts necessary for the understanding of the invention.

The machine 1 comprises a casing 2 and a cap 3 for closing the casing 2 to form, with the casing 2, a case or closed container.

The electric machine 1 comprises a stator 4 fixed to the casing 2 and a rotor 5, inserted in the case, and attached to the case in a rotary manner.

The machine 1 has its own axis of rotation R around which the rotor 5 rotates.

An example of the stator 4 is described in the patent EP2215705 in the name of the same Applicant which is referred to herein in its entirety for the purposes of a complete description.

The electric machine 1 comprises an electronic module 6, partly illustrated in FIGS. 2 to 5, inserted at least partly in the casing 2, for supplying the stator 4.

The electric machine 1 also comprises a heat sink 7 for dissipating the heat generated inside the motor 1, in particular by the electronic module 6.

In the embodiment illustrated, the heat sink 7 is formed by the cap 3 for closing the casing 2.

The electronic module 6 comprises a plurality of electronic components, including, for example, surface-mount electronic components 8, also known as SMD electronic components, and pin-through-hole electronic components 9, also known as PTH electronic components.

The electronic module 6 of the electric machine 1 comprises a printed circuit 10.

The printed circuit 10 is substantially known as a PCB, that is, a Printed Circuit Board.

In the embodiment described in the example, the electronic components 8, 9 are mounted on the same side 10*a* of the printed circuit 10, also defined as the component side of the printed circuit 10.

The components side 10*a* of the printed circuit 10 defines a first side or upper face 10*a* of the electronic module 6.

The electronic components 8, 9 are positioned on the first side 10*a* of the electronic module 8 so that they face towards the cap 3 and are opposite it.

The electronic module 6 also comprises a plurality of conductor tracks 11, such as, for example, the electronic module described and illustrated in the document WO2013008180 by the same Applicant, which implement the direct connections between all the electronic components 8, 9.

The conductor tracks 11 are positioned on a second side 10b, or soldering side or lower face, opposite the components side 10a of the printed circuit 6.

The assembly consisting of the printed circuit 10, the electronic components 8, 9 and the conductor tracks 11, form the electronic module 6 comprising the control circuit of the machine 1 which controls the power supply.

The electronic components "SMD" 8 comprise MOSFETs 12 which are "SMD" electronic power components.

The MOSFETs 12, which are substantially of known type and are therefore not described in detail here, are electronic components having a case 13, with a substantially parallelepiped shape and comprising a plastic part, and a base 14 at least partly metallic by which the MOSFETs 12 are connected to the printed circuit 10.

The MOSFETS 12 embody, in this description, electronic power components which are equipped with a base or tab 14.

The aspects of the invention referred to the MOSFETs are fully valid for any electronic power component having a base 14.

Generally speaking, the base 14 is a packaging for supporting a chip of the electronic component and has both a mechanical function and a thermal and electrical function.

Each MOSFET 12 has a defined height h1 which in the solution shown in the example extends in a direction parallel to the axis of rotation R.

More in general, the height h1 extends in a direction which is substantially perpendicular to the printed circuit 10.

Each MOSFET 12 has its own power connection terminals 15.

In the example illustrated, the terminals 15 of each MOSFET 12 are on opposite sides of the case 13.

Figure 6:
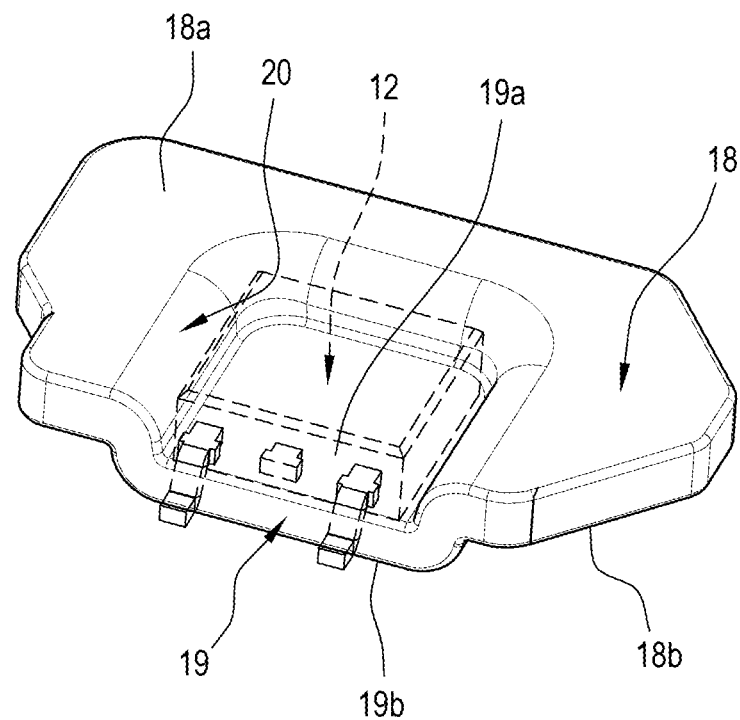
FIG. 6 illustrates a schematic perspective view of a component of a rotary electric machine in accordance with an aspect of the invention.

According to an aspect of the invention, the electronic module 6 comprises a plurality of elements for transferring heat or "heat transfer devices" 17 each connected to at least one respective electronic component 8, such as the MOSFETs 12, and illustrated in more detail, for example, in FIG. 6.

Figure 7:
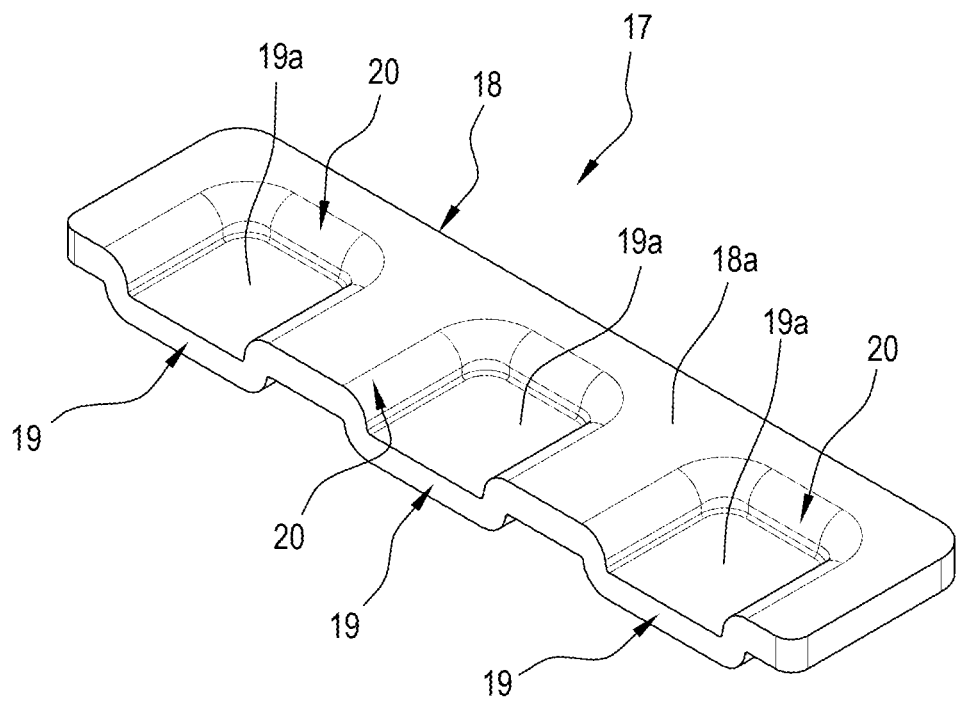
FIG. 7 illustrates a schematic perspective view of a component of a rotary electric machine in accordance with an aspect of the invention.
Figure 8:
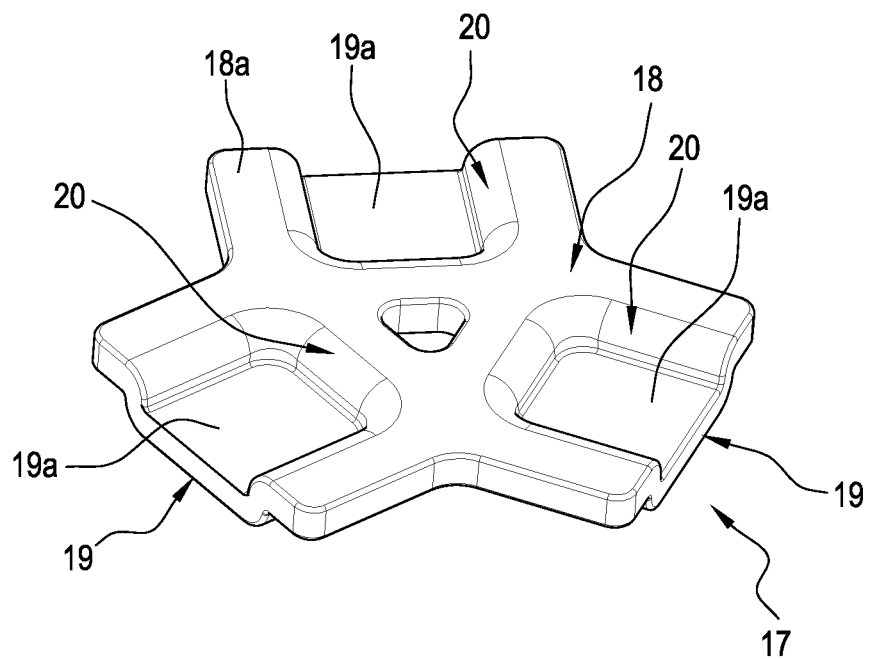
FIG. 8 illustrates a schematic perspective view of a component of a rotary electric machine in accordance with an aspect of the invention.
Figure 9:
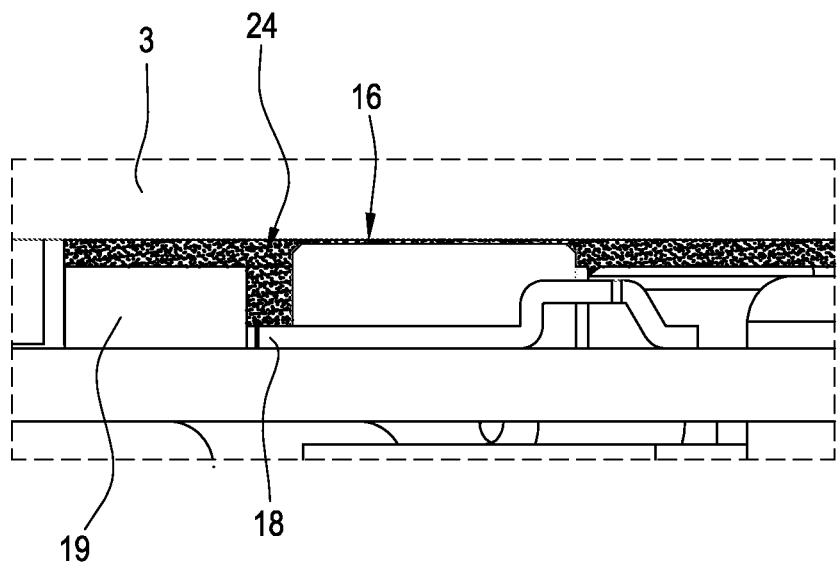
FIG. 9 illustrates a schematic cross-section of a detail of a rotary electric machine of known type.

In an embodiment, illustrated for example in FIGS. 7 and 8, the heat transfer device 17 may be sized to receive more than one electronic component 12.

Figure 2:
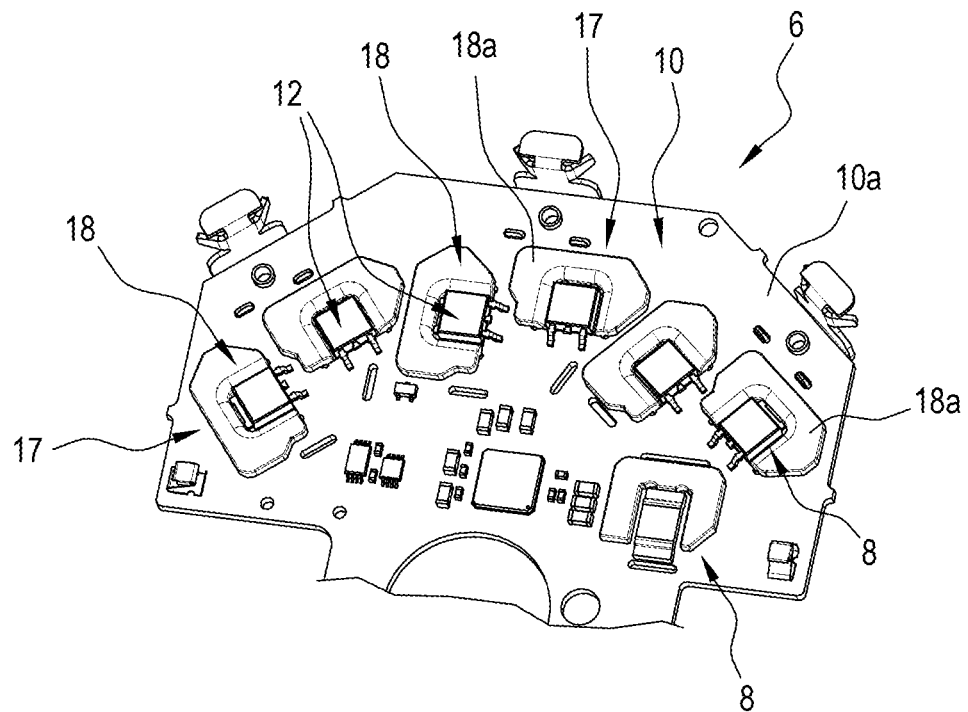
FIG. 2 illustrates a schematic perspective view of a detail of the electronic module for controlling an electric machine in accordance with an aspect of the invention.

As illustrated, for example, in FIGS. 1 and 2, each MOSFET 12 may be connected to a respective heat transfer device 17 as described in more detail below.

The heat transfer device 17 is preferably an element with a high thermal and electrical conductivity of the "SMD" type, that is, "Surface Mount Device".

According to an embodiment, the heat transfer devices 17 are associated with one or more electronic power components, in particular with a respective MOSFET 12, to increase the surface area for heat exchange and favour the transmission of the heat generated inside the component towards the heat sink 7.

In particular each heat transfer device 17 is soldered to the components side 10a of the printed circuit 10, so that it also is facing, at least partly, the cap 3; for simplicity of description, reference is made below to a single heat transfer device 17 the heat transfer devices 17 preferably being all equal to each other.

According to an aspect of the invention, the heat transfer device 17 comprises an upper portion 18 and a base portion 19 connected to the upper portion 18.

In accordance with an aspect of the invention, when the heat transfer device 17 is mounted in the printed circuit 10, the upper portion 18 extends or projects from the printed circuit board 10 towards the heat sink 7, that is, towards the cap 3.

The upper portion 18 projects from the printed circuit 10 on the same side 10a of the respective MOSFET 12, more specifically on the same side 10a of the case 13 of the MOSFET 12.

According to an aspect of the invention, when the heat transfer device 17 is mounted in the printed circuit 10, the base portion 19 is positioned in the printed circuit 10 at least partly underneath the respective electronic component, in particular a MOSFET 12.

According to an aspect of the invention, the base portion 19 has plan dimensions which are greater than or equal to the plan dimensions of the MOSFET 12, in such a way as to maximize the contact surface between MOSFET and heat transfer device.

As illustrated in FIGS. 7 and 8, the base portion 19 is sized to receive a number of MOSFETs 12 greater than one, that is, three in the example illustrated.

In other words, the base portion is divided into as many pads as there are electronic components to be coupled to the heat transfer device 17 and the upper portion 18 is shaped in such a way as to be maximised compatibly with the limits of the size of the electronic module.

The base portion 19 forms, at least partly, a preferential path for the heat generated by the electronic component 12 from the base 14 of the electronic component 12 to the heat sink 7.

Figure 4:
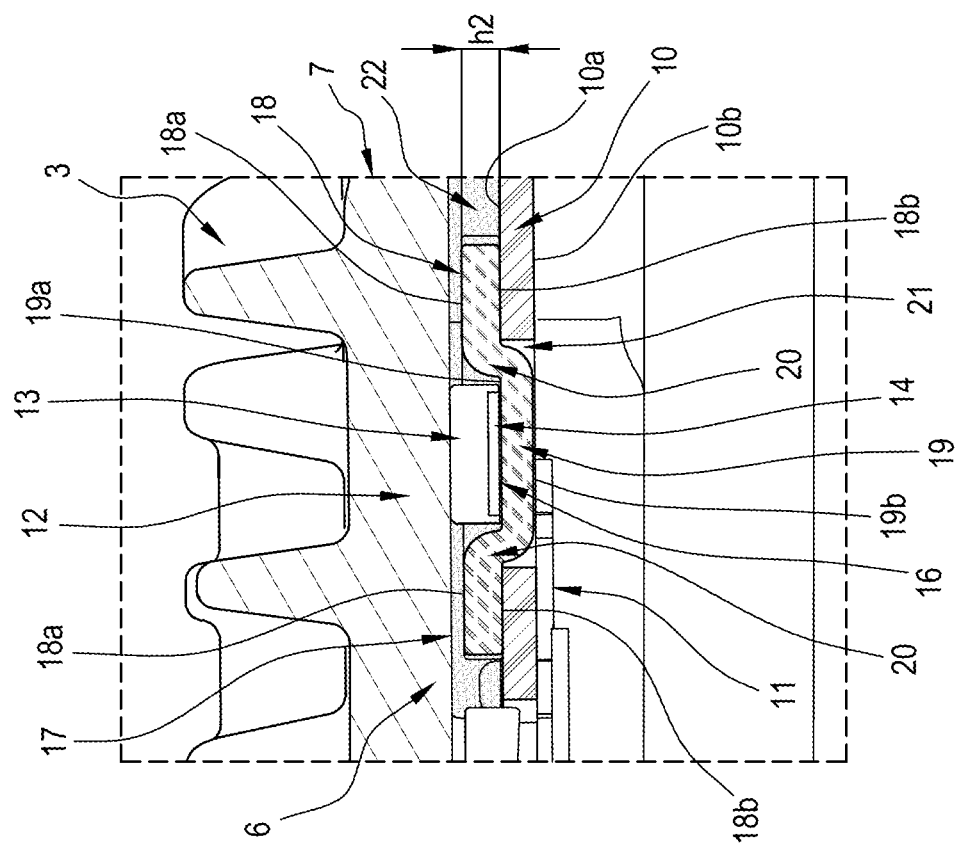
FIG. 4 illustrates a schematic cross section of a detail of an electric machine in accordance with an aspect of the invention.
Figure 5:
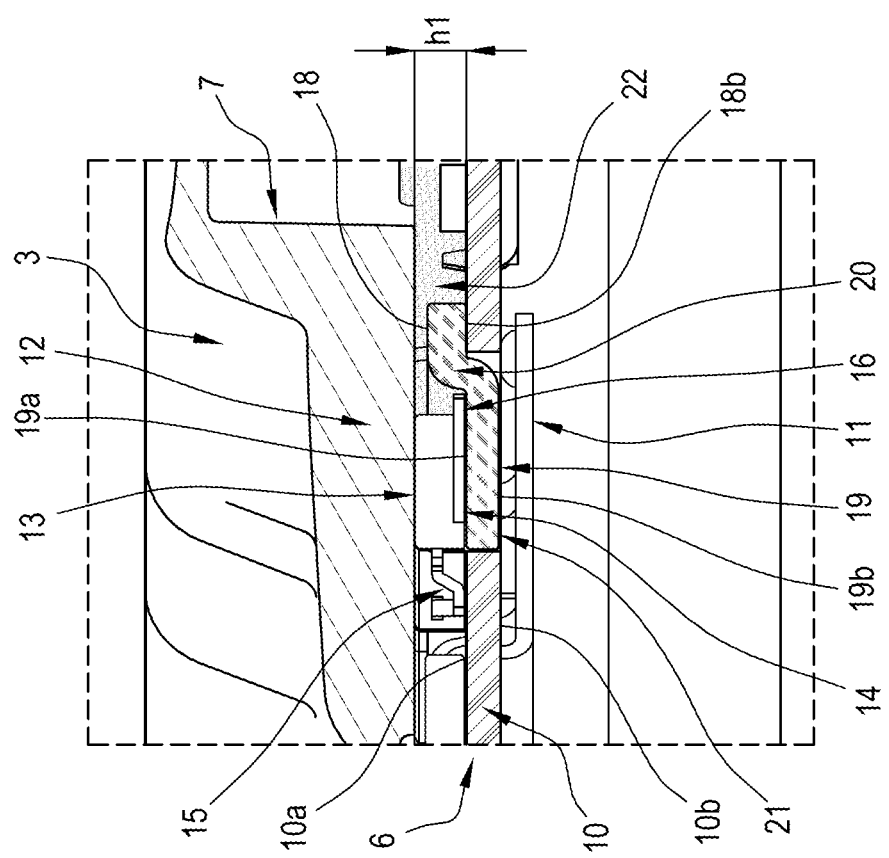
FIG. 5 illustrates a schematic cross section of a detail of an electric machine in accordance with an aspect of the invention.

With particular reference to FIGS. 4 and 5, it can be seen how, in use, the heat generated by the MOSFET 12 flows mostly from the base 14 of the MOSFET to the base portion 19 of the heat transfer device 17 and from there to the upper portion 18.

The upper portion 18 is located in thermal contact with the heat sink 7, that is to say, with the cap 3, in such a way that the heat can be dissipated outside the motor 1.

According to an aspect of the invention, the heat transfer device 17 comprises the base portion 19 from which the upper portion 18 projects in a cantilever fashion.

As illustrated for example in FIG. 6, the upper portion 18 surrounds at least partly the lower portion 19, leaving free a side at the connection terminals of the electronic component 12.

The portion 19 is substantially flat and is designed to receive the MOSFET 12 or several MOSFETs 12; for convenience of description reference is also made to a single MOSFET 12.

The portion 19 has a flat upper face 19a, on which may be positioned the MOSFET 12 with the base 14 resting on the face 19a, and a lower face 19b.

The upper portion 18 extends preferably as a flap, to which explicit reference will be made without thereby limiting the scope of the invention, from the base portion 19.

The upper portion 18 or flap of the heat transfer device 17 has an upper face 18a and a lower face 18b.

The flap 18 extends parallel to the base portion 19 and, according to an aspect of the invention, its shape depends on the free space in the electronic module 6.

Generally speaking, an attempt is made to maximise the surface of the flap 18 since it is designed to exchange heat with the cap 3.

In the example of FIG. 6, the flap 18 surrounds the MOSFET 12 on three sides and in the example of FIGS. 7 and 8 each MOSFET 12 is surrounded on three sides by the upper portion 18.

In embodiments not illustrated, the MOSFETs 12 may be close to each other on the base portion 16 with the upper portion 18 which surrounds only externally the electronic components.

It should be noted that preferably, a solution with several electronic components 12 soldered on a same heat transfer device can be actuated when an electrical connection between the bases of the separate electronic components is desired.

In general, the lower face 18b of the upper portion 18 of the heat transfer device is substantially coplanar with the upper face 19a of the base portion 19.

Since, as described in more detail below, the upper face 19a of the base portion 19 of the heat transfer device 17 is preferably coplanar with the upper face 10a of the printed circuit 10, the relative positioning of the lower face 18b of the upper portion 18 and the upper face 19a of the base portion, that is, the shape of the heat transfer device 17, takes into account the thickness of a solder paste, not illustrated, normally provided under the upper portion 18 for fixing the heat transfer device 17 to the printed circuit 10.

The paste usually has a thickness of approximately 2 tenths of a millimetre.

In that way, when the heat transfer device 17 is soldered to the printed circuit 10, in particular to the first edge 10a, by the lower face 18b of the flap 18, the upper face 19a of the base portion 19 is substantially coplanar with the side 10a of the printed circuit 10.

According to an aspect of the invention, the heat transfer device 17 has a portion 20 for connecting the base portion 19 with the flap 18a.

In an embodiment not illustrated, the upper portion 18 and the base portion 19 of the heat transfer device 17 are soldered to each other and a soldering defines, in practice, the connecting portion 20 between the two portions 18 and 19.

In a preferred embodiment illustrated in the accompanying drawings, the upper portion 18 and the base portion 20 are made in a single body.

The heat transfer device 17 is defined by a single element comprising the upper portion 18 and the base portion 19 of the for example joining the portion 20.

If the heat transfer device 17 is made as a single body it may be made by drawing and/or pressing and cutting from a tinned sheet of thermally conductive material.

The printed circuit 10 comprises a seat 21 for the base portion 19 of the heat transfer device whilst, as mentioned above, the upper portion 18 is above of the printed circuit 10, from the side of the components 12.

Figure 3:
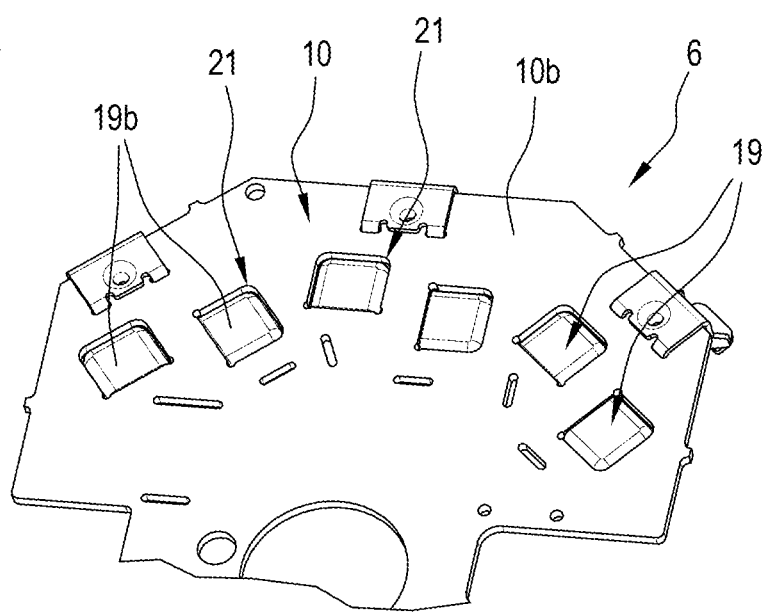
FIG. 3 illustrates a different schematic perspective view of the detail of FIG. 2.

As illustrated, for example in FIG. 3, the base portion 19 of the heat transfer device 17 is inserted in the respective seat 21.

In an embodiment, such as the one illustrated for example, the seat 21 is in the form of a through hole in the printed circuit 10.

In an alternative embodiment, the seat 21 is in the form of a blind hole in the printed circuit 10.

With particular reference to FIGS. 4 and 5, when the heat transfer device is mounted in the printed circuit 10 it should be noted that the flap 18 has the lower face 18b substantially coplanar to the upper face 10a of the printed circuit 10, except for the thickness of the solder paste, not illustrated, between heat transfer device and PCB.

The flap 18 is connected to the printed circuit 10 through its lower face 18b and the heat transfer device 17 is connected to the printed circuit through the flap 18.

In a preferred embodiment, the base portion 19 has the lower face 19b coplanar with the side 10b of the printed circuit 10 or, in alternative embodiments, not illustrated, projecting from it or recessed in it.

In that way, the face 19b may also be used, if necessary, to remove heat from the MOSFET 12.

In an embodiment not illustrated, the base portion 19 of the heat transfer device can be incorporated in the printed circuit 10.

The printed circuit 10 can be produced with a thermally conductive insert substantially at a pad for positioning and fixing the MOSFET.

In this case, during the assembly of the electronic module, the upper portion 18 of the heat transfer device 17 and the MOSFET 12 are soldered to the lower portion 19 incorporated in the printed circuit 10.

Each heat transfer device 17 has a height h2 above the printed circuit 10, defined, in the solution shown in the example, in a direction parallel to the axis of rotation R.

In general, the height h2 extends in a substantially perpendicular direction to the printed circuit 10.

The value h2 also identifies the thickness of the flap 18 which, in the embodiment illustrated by way of example, corresponds to the thickness of the base portion 19 of the heat transfer device 17.

Since the MOSFETs 12 may be brought into direct contact with the cap 3 through the above-mentioned plastic part of their case 13 (therefore without any electrical short-circuit problems), the machine 1 comprises a layer of thermally conductive and electrically isolating filler material 22 interposed between the heat transfer device 17 and the heat sink 7.

The material 22 may be for example in the form of a paste interposed at least between the heat transfer device 17 and the heat sink 7.

Since between the MOSFET 12 and the heat transfer device 17 there is direct contact at the base 14, the interposing of a layer of material 22, for example the so-called "thermally conductive gap filler", with a thickness between the values of the heights h1-h2, between the heat transfer device 17 and cap 3 creates a preferential path for the transfer of the heat dissipated by the MOSFET 12.

The heat transfer device 17 acts as a "thermal joint", that is, a means favouring the transfer of the heat generated by the MOSFET 12 towards the cap 3.

Each heat transfer device 17 has the upper face 18a of the flap 18 facing towards the cap 3; the upper face 18a defines the heat exchange surface by which the heat transfer device 17 transfers most of the heat generated by the MOSFET 12 to the cap 3 which, as already mentioned, acts in turn as a heat sink.

The area of the surface 18a is made as large as possible, as mentioned, within the design constraints for size, so as to minimise the resistance to the passage of heat.

A part of the heat generated by each MOSFET 12 is transferred to the cap 3 also by the case 13 facing it which is preferably in mechanical contact with the cap 3.

However, most of the heat generated by each MOSFET 12 is transferred to the cap 3 by the corresponding heat transfer device 17.

According to an aspect of the invention, the height h2 of each heat transfer device 17, in particular of the upper portion 18, is less than the height h1 of the case 13 of the corresponding MOSFET 12, so that the MOSFETs 12 act as spacer elements separating the cap 3 from the heat transfer devices 17, thus preventing any short circuits which could occur following direct contact between the heat transfer devices 17 and the cap 3 of the machine 1.

Alternatively, if the height h2 of the heat transfer device 17, in particular of the portion 18 on the components side 10a, is greater than the height h1 of the case 13 of the MOSFET 12, an alternative arrangement for preventing the short circuits resulting from direct mechanical contact between the heat transfer device 17 and the cap 3 would be to insert a thermally and electrically conductive material, such as "Sil-Pad", between the cap 3 and the upper face 18a of the heat transfer device 17.

The invention claimed is:

1. A rotary electrical machine comprising:
    an electronic module,
    a heat sink for dissipating the heat generated by the electronic module;
    the electronic module comprising a printed circuit and an electronic component connected to the printed circuit and having a base,
    a heat transfer device connected to the printed circuit and at least to the electronic component for transferring heat generated by the electronic component to the heat sink, the heat transfer device comprising an upper portion extending from the printed circuit towards the heat sink at a same side of the printed circuit on which is mounted the electronic component,
    a layer of thermally conductive material interposed between the upper portion of the heat transfer device and the heat sink, the heat transfer device transferring the heat generated by the electronic component to the heat sink via the thermally conductive material,
    wherein the heat transfer device comprises a base portion connected to the upper portion by a connecting portion, the base portion positioned in the printed circuit at least partly under the base of the electronic component to form, at least partly, a preferential path for the heat generated by the electronic component from the base of the electronic component to the heat sink, the electronic component being connected at least partly by the base to the base portion of the heat transfer device,
    wherein the preferential heat path follows a U-shaped path, downward from the base of the electronic component to the base portion of the heat transfer device, laterally to the connecting portion, and then upward to the upper portion and the heat sink.

2. The machine according to claim 1, wherein the printed circuit comprises a seat for the base portion of the heat transfer device, the base portion being inserted in the seat.

3. The machine according to claim 2, wherein the seat is configured as a through hole in the printed circuit.

4. The machine according to claim 1, wherein the base portion of the heat transfer device is incorporated in the printed circuit.

5. The machine according to claim 1, wherein the base portion has an upper face coplanar with an upper face of the printed circuit, the electronic component being at least partly connected to the upper face of the base portion of the heat transfer device.

6. The machine according to claim 1, wherein the upper portion of the heat transfer device comprises a wing which projects in a cantilever manner from the base portion on a same side as the electronic component, the wing being thermally in contact with the heat sink.

7. The machine according to claim 1, wherein the upper portion has a lower face substantially coplanar with an upper face of the printed circuit.

8. The machine according to claim 1, wherein the upper portion is connected to the printed circuit by a relative lower face.

9. The machine according to claim 1, wherein the upper portion and the base portion of the heat transfer device are made as a single body, the heat transfer device being defined by a single element comprising the upper portion and the base portion.

10. The machine according to claim 1, wherein the base portion has overall plan dimensions greater than or equal to plan dimensions of the electronic component.

11. The machine according to claim 1, wherein the electronic component is soldered to the base portion of the heat transfer device.

12. The machine according to claim 1, wherein the electronic module comprises a plurality of electronic components, each having a respective base connected by the respective base portion of the heat transfer device.

13. The machine according to claim 1, wherein the base portion has a lower face coplanar with a lower face of the printed circuit or protruding from the lower face of the printed circuit, or recessed in the printed circuit, the printed circuit comprising a seat configured as a hole passing through the base portion of the heat transfer device, the base portion being inserted in the seat.

14. The machine according to claim 1, wherein the upper portion and the base portion of the heat transfer device are parallel to each other.

* * * * *